United States Patent [19]

Germanton et al.

[11] Patent Number: 4,631,350
[45] Date of Patent: Dec. 23, 1986

[54] LOW COST THERMOCOUPLE APPARATUS AND METHODS FOR FABRICATING THE SAME

[76] Inventors: Damon Germanton, 7 Alberta Dr., Kennelon, N.J. 07405; Donald Weiss, 200 Cliffside Park, Englewood, N.J. 07631

[21] Appl. No.: 567,377

[22] Filed: Dec. 30, 1983

[51] Int. Cl.⁴ ............................................. H01L 35/28
[52] U.S. Cl. ..................................................... 136/225
[58] Field of Search .................. 29/573; 136/208, 213, 136/225; 357/15

[56] References Cited
U.S. PATENT DOCUMENTS

| | | | |
|---|---|---|---|
| 2,519,785 | 8/1950 | Okoliesanyi | 136/212 |
| 3,071,495 | 1/1963 | Hänlein | 136/212 |
| 3,607,445 | 9/1971 | Hines | 136/225 |
| 3,981,751 | 9/1976 | Dashevsky et al. | 136/212 |
| 4,018,625 | 4/1977 | Tinti | 136/225 |
| 4,111,717 | 9/1978 | Baxter | 136/213 |
| 4,211,888 | 7/1980 | Stein et al. | 136/225 |
| 4,276,441 | 7/1981 | Wilson | 136/225 X |
| 4,365,106 | 12/1982 | Pulvari | 136/213 X |

*Primary Examiner*—John F. Terapane
*Assistant Examiner*—T. J. Wallen
*Attorney, Agent, or Firm*—Arthur L. Plevy

[57] ABSTRACT

A thermocouple consists of a first thin layer of metal disposed on a mylar sheet. The metal layer is then covered with a varnish by employing a printing process which prints spaced apart apertures on the metal layer indicative of a hot junction and a reference junction terminal. Another top metal layer is deposited upon the varnish layer in a line grating pattern to cover one hole in each pair to thus form a hot junction by connecting the top metal layer to the first layer via the hole. The other aperture forms one terminal of the reference junction. The metal layers are extremely thin as deposited by a vapor evaporation process and hence the thermocouple exhibits a rapid response to temperature change. The method of fabrication of the devices enables one to provide mass produced units at extremely low cost.

7 Claims, 16 Drawing Figures

LOW COST THERMOCOUPLE APPARATUS AND METHODS FOR FABRICATING THE SAME

BACKGROUND OF INVENTION

This invention relates to thermocouples and more particularly to an economical thermocouple which, based on its low cost, can be employed as a disposable unit.

The prior art is replete with a host of patents and devices describing thermocouple devices of various configurations and constructions.

Essentially, a thermocouple is an electric circuit consisting of a pair of wires of different metals jointed together at one end called the sensing junction and terminated at the other end in such a manner that the terminals are both at the same and a known temperature. This is called the reference junction and the known temperature is called the reference temperature. The terminal leads of the reference junction are connected to a high input inpedance amplifier and due to the thermoelectric effect (Seebeck effect) a voltage is created across the reference junction whenever the sensing junction and the reference junction are at different temperatures. The magnitude of the voltage is an indication of the temperature difference. Usually, the reference junction is held at a known constant temperature or is electrically compensated for variations from a preselected temperature.

The prior art has employed a host of different metal wires to implement the thermocouple structure. The materials employed have been Chromel, Alumel, Constanton, copper, iron, platinum, alloys of platinum as platinum and rhodium, tungsten, tungsten-rhenium alloys, nickel and ferrous nickel alloys.

The thermoelectrical emf which causes current flow through a circuit is also dependent upon the junction wire materials and the temperature difference between the junctions. Their characteristics are well known in the field. See a text entitled *Electronics Engineers Handbook* by D. G. Fink and A. A. McKenzie (1975) (1st Edition) McGraw-Hill, Inc. Section 10, "Transducers".

As indicated, the use of the thermocouple to measure temperature is well known and the applications are many.

In any event, a major problem exists in the measurement of human body temperature. Essentially, each year about 1 billion temperature measurements are made at hospitals in the U.S.A., and the number of measurements made throughout the world is of a greater magnitude. Due to the progress made in the field of medical electronics, there has been a widespread use of the electronic thermometer, especially for hospital use. These devices employ a temperature probe which is coupled to a suitable electronic circuit and display to measure body temperature. The probe is inserted into the mouth of a user during a measurement and a display indicates the temperature.

Examples of such instruments are many and many different companies supply and sell such devices for hospital use. It is, of course, apparent that in order to employ such a thermometer for hospital use, one must provide probe isolation from one patient to another. In this manner a plastic sterilized probe cover is employed. The cover is used to enclose the probe for each temperature measurement and is then discarded and a new cover inserted for the next measurement. Even though the covers are disposable and made from an inexpensive plastic, their cost is significant when one considers the number of temperature measurements made during a prolonged interval.

Based upon such considerations, if a savings in this component of only a fraction of a penny or more could be had, this would result in a substantial savings over the course of a year.

Apart from this factor is the fact that the probe section of the thermometer which is constantly being covered and measured is subjected to extensive wear and this probe has to be replaced at frequent intervals as well. The probe is a relatively expensive component in such devices and replacement of the same necessitates a recalibration of the instrument.

A further problem with the conventional thermometer is the excessive time required to take a patient's temperature. Due to the above considerations the plastic covered probe is of a relatively large mass and hence takes an appreciable amount of time to indicate the temperature. In such devices, one must be sure that the displayed temperature is correct and hence one must wait for the plastic covered probe to heat up during a temperature measurement. Any reduction in this time results in a great savings in time due to the huge number of temperature measurements made as described above.

It is therefore an object of the present invention to provide a thermocouple device which, based on its construction, is extremely inexpensive and adapted to replace the conventional probe and plastic cover for human body temperature measurements.

It is a further object to provide a method of manufacturing a thermocouple device which method enables one to provide a rugged low-cost unit particularly adapted for human measurements which unit can provide a rapid response to body temperature.

A further object of the present invention is to provide a method of fabricating a thermocouple employed in measuring temperature.

BRIEF DESCRIPTION OF THE PREFERRED EMBODIMENT

A thermocouple device comprising a planar plastic layer having disposed thereon a first thin layer of a thermocouple element metal, a layer of an insulator material disposed upon and covering said first layer of metal with said insulator layer having first and second apertures on a surface with said apertures positioned at opposite ends of said layer and spaced apart one from the other on either side of an imaginery line extending from one end to the other; a second thin layer of a thermocouple element metal disposed on top of said insulator layer and covering said first aperture and extending as a strip from said one end to the other, with said first and second metal layer contacting each other via said first aperture to form a hot junction and with said second aperture enabling contact with said first layer to form one terminal of said reference junction, the other terminal supplied by contact with said second metal layer.

DETAILED DESCRIPTION OF THE FIGURES

Figure 1:
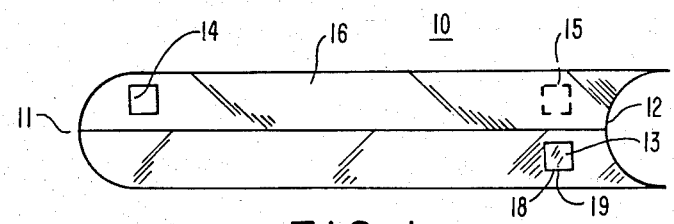
FIG. 1 is a top plan view of a thermocouple device according to this invention.

Referring to FIG. 1, there is shown a top plan view of a low cost thermocouple 10 according to this invention.

The thermocouple 10 has a rounded end 11 for insertion into the mouth of a user.

The opposite end 12 is concave and is for insertions into a holder which enables the thermocouple 10 to be plugged into and removed from an electronic sensing circuit with a display to indicate temperature as will be explained. The sensing junction or hot junction 14 is in close proximity to the rounded end 11, while the reference junction or cold juntion terminals 13 and 15 are in close proximity to the concave end 12. As seen in FIG. 1, the upper section 16 of the thermocouple 10 consists of an extending strip of a first thermocouple metal, which is adjacent to a layer of an insulative lacquer or varnish 17. The lacquer layer 17 has a window 18 disposed therein which window contacts a bottom layer of metal 19.

The sensing junction 11, as will be explained, is formed by allowing the metal layer 16 to contact the metal layer 19 through an aperture in the lacquer layer 17 and as will be explained which is implemented during the construction process.

Figure 2:
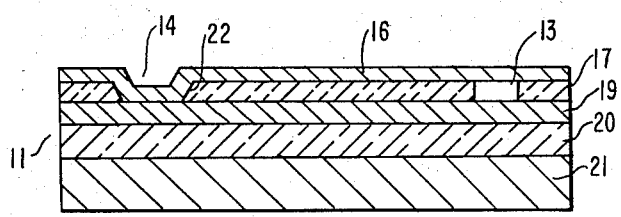
FIG. 2 is a side plan view of the thermocouple device.

Referring to FIG. 2, there is shown a side plan view of the thermocouple device 10.

As seen from FIG. 2, the thermocouple 10 is a composite device of a laminated or layered construction. The device may have a bottom paper board layer 21 which is relatively thick and which acts as a supporting base plate if thickness is desired. Disposed upon the layer 21 is a thin plastic sheet 20 which preferably is fabricated from Mylar. Deposited on the plastic sheet 20 is the layer of thermocouple metal 19. Disposed on top of the metal layer 19 is the lacquer layer 17. The lacquer layer has two apertures as 13 and 22. The aperture 13 allows one to contact metal layer 19 to provide one terminal for the cold or reference junction, while the aperture 22 allows contact between the metal layer 19 and the metal layer 16 to form the hot or sensing junction 11.

Figure 3:
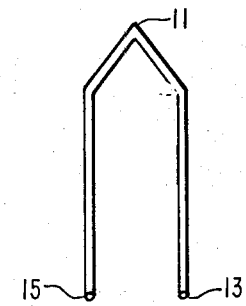
FIG. 3 is a schematic diagram of a thermocouple circuit.

Referring to FIG. 3, there is shown a simple schematic of a thermocouple element with the reference numerals of FIGS. 1 and 2 used to designate the appropriate locations.

The device 10 depicted in FIG. 1 and 2 is approximately 2 to 3 inches in length from end 11 to 12, with a width of about ¼ inch. These dimensions can vary according to requirements and there is no intention of being limited by the same. Before proceeding with a description of the fabrication techniques, it is indicated that the metal layers 16 and 19 are preferably elements rather than alloys. As indicated above, many thermocouples employ alloy composition for the elements. In this application element metals are employed such as tin and bismuth for the metal layers 16 and 19, due to the processes utilized and as will be further explained.

Figure 4A:
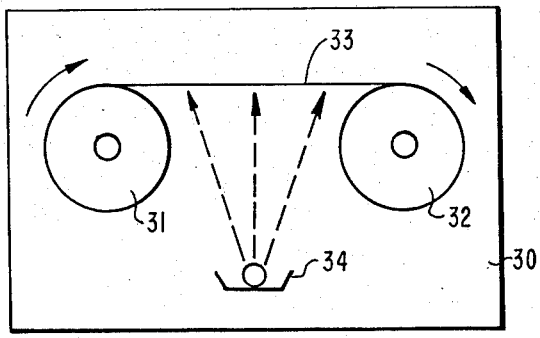
FIGS. 4A to 4E depict the steps in the process of fabricating the thermocouple device.

Referring to FIG. 4A, there is shown the first step in the fabrication process of the thermocouple 10. A vacuum chamber 30 is shown. Such chambers 30 are well known and are used for potato chip bags, metallic wrapping paper, etc.

The vacuum chamber contains two rotatable spools 31 and 32 having disposed between them a sheet of mylar 33. Essentially, spool 32 is a takeup spool while spool 31 is a feed spool. The mylar sheet 33 may be a few feet in width for large production capability and is between 0.001–0.01 inches thick. Mylar sheets of such size are conventional and are employed for many purposes. The sheet 33 is caused to move from spool 31 to spool 32. Disposed in the vacuum chamber 30 is a vapor deposition apparatus 34. The apparatus 34 evaporates or sputters a thin layer of metal 19 on the Mylar sheet 33. The mylar sheet 33 as is ascertained functions as the sheet or layer 20 shown in FIG. 2.

The vapor evaporation apparatus 34 is also well known and one can coat mylar or plastic sheets with thin layers of metal by vapor evaporation or other processes. Essentially, the metal layer 19 may be tin or bismuth or some other thermocouple metal element. It is important to note that by utilizing vapor evaporation or vacuum sputtering, which are reliable processes, one cannot conveniently employ an alloy due to the fact that the evaporation processes will alter the alloy and change its characteristics.

Figure 5A:
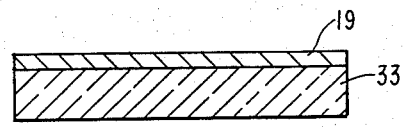
FIGS. 5A to 5F show the devices provided at each step of the process.

The vacuum chamber 30 is held at a high vacuum condition ($10^{-5}$ to $10^{-6}$ torr). The metal material to be evaporated is heated by an electron beam or otherwise until it vaporizes. The vaporized material radiates (dashed lines) where it is deposited upon the mylar film 33. The film may also be preheated to maintain good adhesion. This is a conventional technique used for coating plastic film with metals. One could also employ a sputtering technique which can be implemented in a low pressure gas atmosphere. The layer of metal 19 is about 2,000 to 5,000 Angstroms thick and hence is an extremely thin layer which serves to coat the mylar sheet. See cross sectional view of FIG. 5A to the right of FIG. 4A.

Figure 4B:
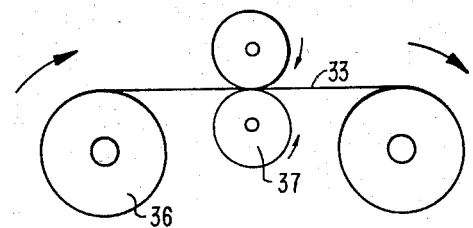
Figure 5B:
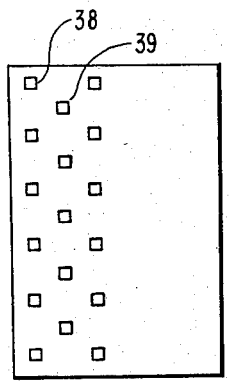

Referring to FIG. 4B, the metal coated Mylar sheet as gathered on spool 32 is now removed from the chamber 30 and positioned as the feed spool 36 on a printing press structure. The printing process is also a well known technque and a varnish is used to coat the metal with a varnish layer 36. The printing cylinder 37 contains a die surface wherein the varnish is coated over the metal layer 19 leaving holes as 38 and 39 in the lacquer layer 36, which holes are used to provide the hot junction as well as the terminal of the cold junction as apertures 13 and 14 of FIG. 2. The printing of varnish-like lacquers on any surface is well known. During the process depicted in FIG. 4B, the entire metal coating is printed with the varnish or lacquer layer 33 leaving the spaced apart apertures. Hence the processed sheet appears from a top view as shown in FIG. 5B. The hole spacing as between 38 and 39 is about 2 inches with the offset being about ⅛ of an inch. Each aperture 38 and 39 (FIG. 5C) may be a square of 1/16 inch or a rectangle with a 1/16 inch width and ⅛ inch or more in length.

Figure 5C:
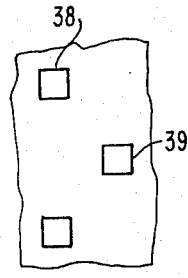

As seen from FIG. 5C, each aperture as 38 and 39 are printed on either side of an imaginery center line 70. The apertures are successively staggered along the length of the coated sheet as shown in FIG. 5C.

Figure 5D:
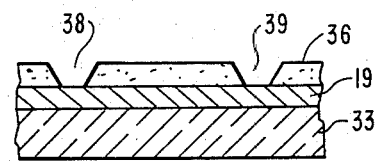

FIG. 5D shows a representative cross section depicting apertures 38 and 39 and showing the openings coacting with the metal layer 19.

Figure 4C:
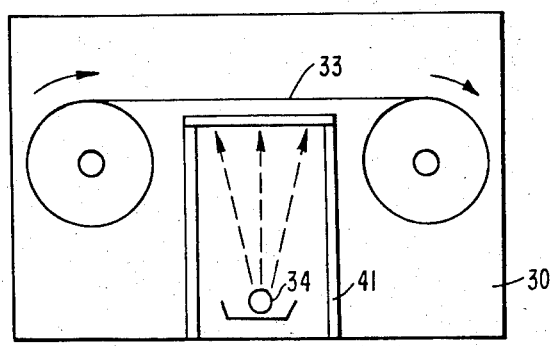
Figure 5E:
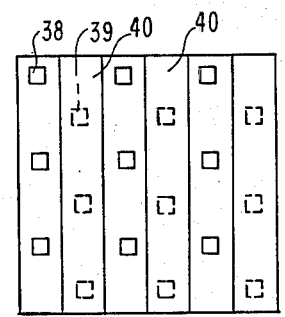

Referring to FIG. 4C, the varnished printed sheet is now returned to the vacuum chamber 30 where the second metal layer 40 is evaporated in a line pattern as the sheet 33 is moved from spool to spool. A grid mark 41 is disposed in the chamber to force the radiated metal from the evaporation apparatus 34 to deposit on the sheet in a line pattern as shown in FIG. 5E.

Figure 5F:
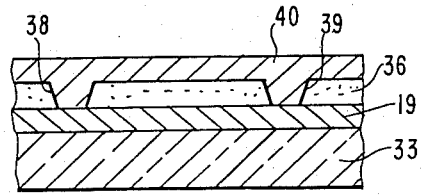

The lines of metal 40 cover each of the holes 39 to form a contact Junction or hot junction with the metal layer 19 via the aperture 39. The other apertures as 38 remain exposed to allow contact to the metal layer 19. The metal layer 40 evaporated during this step 4C would be bismuth or tin as opposed to the metal used for layer 19. The cross sectional view of a portion of the structure is depicted in FIG. 5F. The layer 40 is also between 2,000 to 5,000 Angstroms thick and hence is also an extremely thin layer.

Figure 4D:
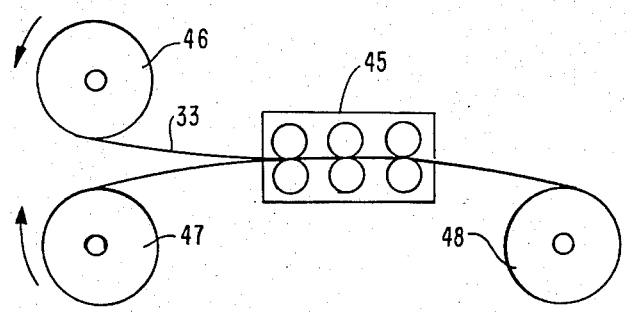

The resultant treated sheet after the process depicted in FIG. 4C may be then placed on one feed spool of a liminator 45 as shown in FIG. 4D if required. The treated Mylar sheet 33 is positioned on a feed spool 45, with the other feed spool containing the cardboard support layer as layer 21 of FIG. 1. The treated sheet 33 is then bonded to the cardboard sheet 48 within the laminator 45. Lamination of plastic to paper, cardboard and so on is also a well known technique and various inert adhesives can be employed as hot or cold melt adhesives which are completely non-toxic as those used for stamps, envelopes and so on. The cardboard sheet may be approximately 0.02 inches thick to act as a base or support.

Figure 4E:
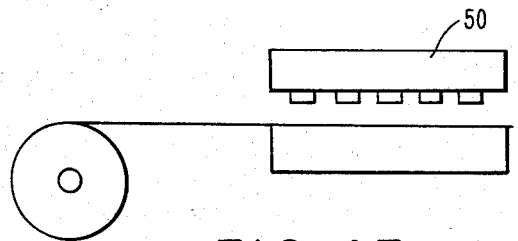

The takeup spool 48 of the laminator collects the processed sheet. The material from spool 48 is then fed into a die cutter apparatus 50 as depicted in FIG. 4E where it is cut to form a plurality of thermocouples as shown in FIGS. 1 and 2.

The above described process enables one to mass produce extremely large quantities of thermocouples for use in measuring temperature. Due to the fact that the netal layers and the substrate are extremely thin, the device has a rapid response time to temperature. The thermocouple is sterilized and packaged separately and is used once for a temperature measurement and then discarded. The resultant structure is less expensive than the plastic tube covering devices of the prior art and is a complete thermocouple. Thus the apparatus eliminates the expensive temperature probe as well as the plastic covering for the probe. Due to the structure, the device responds rapidly to temperature because of the thickness of the thermocouple metal elements and hence provides a rapid readout with associated electronic circuitry.

Figure 6:
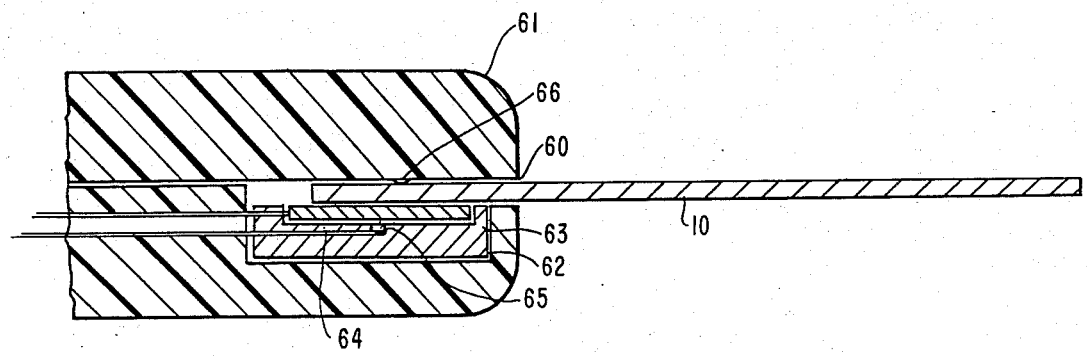
FIG. 6 is a simple block diagram of the thermocouple inserted in a socket housing.

Referring to FIG. 6, the thermocouple device 10 is shown inserted into a socket 60 associated with an insulated housing 61.

Figure 6A:
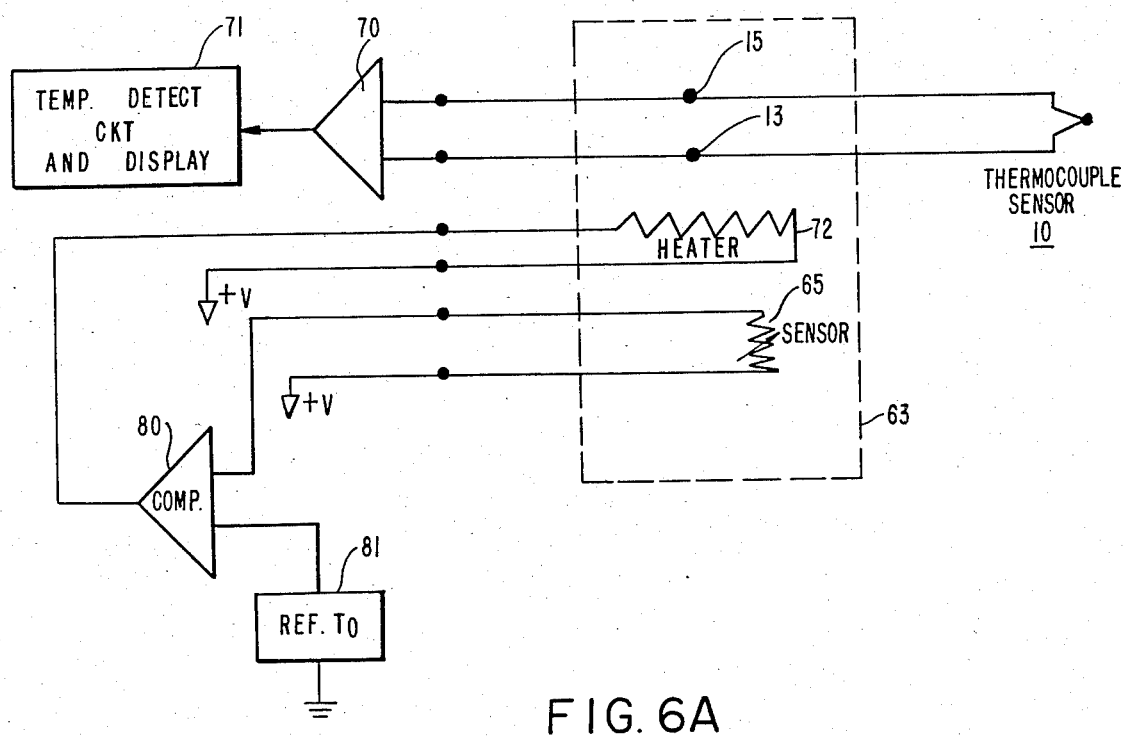
FIG. 6A is a simple schematic circuit.

The thermocouple as shown in FIG. 6A has two output leads via the cold junction which are coupled to the input of a high impedance operational amplifier as 70. As can be seen from FIG. 6, there is an internal hollow 62 within the housing. The hollow contains a metal block 63 which may be formed of copper. The block 63 has an aperture on the top surface into which is inserted a heating element 64. Underlying the heating element 64 is a RTD temperature sensor or temperature sensitive resistor 65. The heating element as well as the sensor has output leads which are coupled through appropriate slots in the housing.

Also shown in FIG. 6 is a contact 66. Contact 66 is on of two contacts which are located within the housing and are spaced apart to provide the required contact with the thermocouple terminals as shown in FIG. 3 as 15 and 13. Essentially, as depicted in FIG. 6A, the output of the amplifier 70 is directed to the input of a temperature detection circuit and display.

There are a plethora of circuits as 71 for responding to a change in emf as desired form a thermocouple to provide an output display via an LCD display or other to indicate the temperature as manifested by the change in voltage. In regard to FIG. 6A the heater element as 64 of FIG. 6 is a metal resistor 72. The sensor as 65 operates to provide the variable resistance in response to temperature.

As shown in FIG. 6A, a comparator 80 has one input coupled to the sensor 65 and another input coupled to a source of reference voltage indicated as reference temperature. The compartor 80 may be a digital comparator and serves to compare the sensor temperature 65 with the reference temperature as determined by circuit 81. The output of the comparator controls the application of potential to the heater 72 which then serves to heat or cool the copper block as desired. In this manner, the temperature of the thermocoupled junction can be held very close to the desired measuring temperature such as the temperature of the human body. Hence the circuit need only respond to a small temperature differential to obtain accurate temperature reading by using the thermocouple of the invention.

It is, of course, a major factor that the above described application discloses a simple and inexpensive thermocouple which can be mass-produced in large quantities and which device is simple to use and disposable to allow an increased savings in time and money when implementing body temperature measurements.

This allows wide variations in EMF to be acceptable which allows higher yield and lower manufacturing costs. For example, if a 25° F. temperature differential exists without a heater and a 25° F. variation exists with a heater, the acceptable tolerance of variations in EMF is increased by a factor of ten.

We claim:
1. A thermocouple device, comprising:
a planar plastic layer member of a rectangular configuration and having a given length greater than the width, said member having disposed on said surface a first thin layer of a thermocouple element metal completely covering the same, a layer of an insulator material disposed upon and completely covering said first thin layer of said thermocouple element metal, said insulating layer having a first aperture near one end and located above a center line parallel to said longer sides, and a second aperture at said other end and located below said center line, each of said apertures directed through said insulating layer to directly contact said first metal layer, a second thin layer of a different thermocouple metal disposed on top of said insulating layer and positioned above said center line and directed from one end to the other along the length to overlie said first aperture with said second metal layer contacting said first metal layer via said first aperture to form a hot junction for said thermocouple, with said second aperture in contact with said first layer forming one terminal of a reference junction and with the other terminal supplied by contact with said second metal layer at a point above said center line and adjacent to said second aperture.

2. The thermocouple device according to claim 1, wherein said first and second metal layers are tin and bismuth.

3. The thermocouple device according to claim 1, wherein said first and second metal layers are between 2,000 to 5,000 Angstroms thick.

4. The thermocouple device according to claim 1, wherein said plastic layer is a plastic sheet.

5. The thermocouple device according to claim 1, wherein said insulator material is an insulator varnish.

6. The thermocouple device according to claim 1, wherein said thermocouple device has a rounded end near said first aperture and a concave end near said second aperture.

7. The thermocouple device according to claim 1, wherein said first and second apertures are rectangular in shape.

* * * * *